(12) United States Patent
Bair et al.

(10) Patent No.: US 6,758,689 B1
(45) Date of Patent: Jul. 6, 2004

(54) WIRELESS ADAPTER HAVING FOLDABLE GEOMETRICALLY LOOP-LIKE ANTENNA

(75) Inventors: Patrick Harold Bair, Camarillo, CA (US); James Dexter Tickle, Moorpark, CA (US); Lev Freidin, Simi Valley, CA (US); Carlos Solis Sanchez, Oxnard, CA (US)

(73) Assignee: Interlink Electronics, Inc., Camarillo, CA (US)

( * ) Notice: Subject to any disclaimer, the term of this patent is extended or adjusted under 35 U.S.C. 154(b) by 0 days.

(21) Appl. No.: 10/447,564

(22) Filed: May 29, 2003

(51) Int. Cl.[7] .............................................. H01R 13/44
(52) U.S. Cl. ...................... 439/136; 439/916; 343/702
(58) Field of Search ............................. 439/916, 136, 439/640, 11, 13, 638; 343/702, 906, 900, 880, 700 MS; 455/90, 102, 348

(56) References Cited

U.S. PATENT DOCUMENTS

| | | | | |
|---|---|---|---|---|
| 4,986,763 A | * | 1/1991 | Boyle | 439/165 |
| 6,259,897 B1 | * | 7/2001 | Kim | 455/575.7 |
| 6,359,591 B1 | * | 3/2002 | Mou | 343/702 |
| 6,394,813 B1 | | 5/2002 | Stout et al. | |
| 6,544,075 B1 | | 4/2003 | Liao | |
| 6,545,643 B1 | * | 4/2003 | Sward et al. | 343/702 |
| 6,612,874 B1 | * | 9/2003 | Stout et al. | 439/640 |
| 2004/0041989 A1 | * | 3/2004 | Olson et al. | 353/122 |

OTHER PUBLICATIONS http://www.netgear.com/products/prod_details.pho?prodID=173□□.*

* cited by examiner

*Primary Examiner*—P. Austin Bradley
*Assistant Examiner*—Phuongchi Nguyen
(74) *Attorney, Agent, or Firm*—Brooks Kushman P.C.

(57) ABSTRACT

A system and a method for protecting a connector and a body of a wireless adapter with a geometrical loop antenna. The loop antenna folds over the body of the wireless adapter to protect the connector and the body. The wireless adapter may be used to connect a peripheral device to a host device. The body of the wireless adapter includes a body stop operable for receiving the loop antenna. The system may also include a cap for protecting the connector of the wireless adapter. In this instance, the loop antenna folds over the cap to lock the cap in place on the connector. A cap may also be integrated into the distal end of the loop antenna.

18 Claims, 2 Drawing Sheets

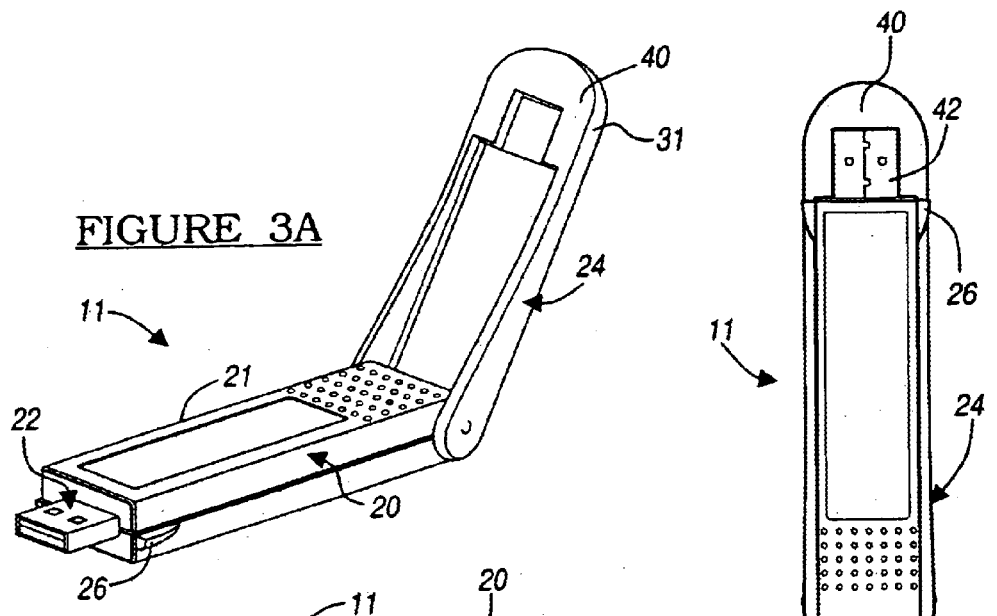
FIGURE 3A
FIGURE 3B
FIGURE 3C
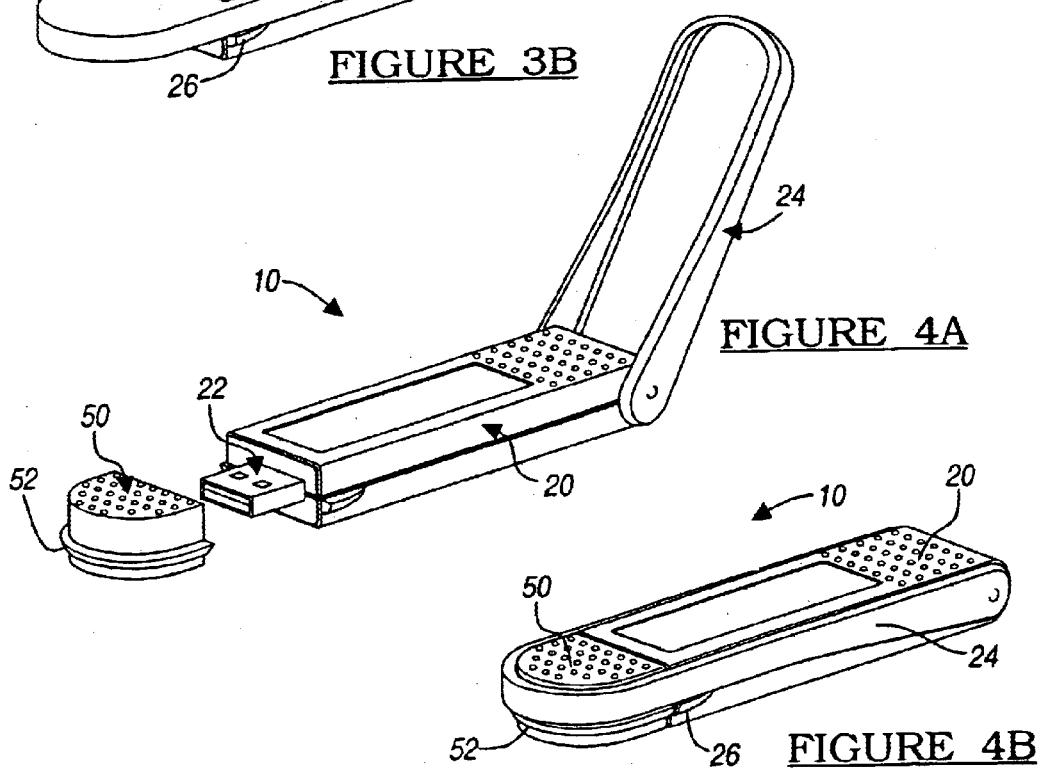
FIGURE 4A
FIGURE 4B

WIRELESS ADAPTER HAVING FOLDABLE GEOMETRICALLY LOOP-LIKE ANTENNA

BACKGROUND OF THE INVENTION

1. Field of the Invention

The present invention relates generally to a wireless adapter having a connector which connects with a host device in order to interface a peripheral to the host device via the wireless adapter. More particularly, the present invention relates to a wireless adapter having a connector and a geometrically loop-like antenna in which the loop antenna is foldable to surround the sides of the connector and thereby protect the connector when the connector is disconnected from the host device.

2. Background Art

Wireless adapters enable host devices such as computers to communicate with external peripherals such as remote controls without requiring a wired connection between the host devices and the peripherals. Other examples of peripherals include joysticks, scanners, digital cameras, wireless network antennas, wireless keyboards, and wireless mouses. A typical wireless adapter has a connector which connects with the host device in order to connect the wireless adapter to the host device. Such a connector may be a universal serial bus (USB) plug or card. In these instances, the host device includes a corresponding USB port or slot.

In order to communicate with a host device and a peripheral, a wireless adapter includes a transmitter and/or a receiver which are housed within a body. The connector is connected at one end to the body. The transmitter and receiver communicate with a host device through the connector when the connector is connected to the host device. The wireless adapter further includes an antenna connected to the body. The transmitter and the receiver wirelessly communicate signals with the peripherals via the antenna.

The physical integrity of the connector of a wireless adapter is important to maintain in order to ensure proper operation of the wireless adapter. It is especially important to maintain the physical integrity of any connector openings such as open-faced ports typically employed by USB connectors. As such, when the wireless adapter is not in use and is disconnected from a host device it is important to protect the connector from physical damage and external elements such as moisture, dust, etc.

SUMMARY OF THE INVENTION

Accordingly, it is an object of the present invention to provide a wireless adapter having a foldable geometrically loop-like antenna.

It is another object of the present invention to provide a wireless adapter having a connector and a loop antenna in which the loop antenna is foldable, to surround the sides and front face of the connector and thereby protect the connector when the connector is disconnected from the host device.

It is a further object of the present invention to provide a wireless adapter having a connector capped by a cap, and further having a loop antenna which is foldable to lock the cap in place on the connector and thereby prevent the cap from being inadvertently removed from the connector.

It is still another object of the present invention to provide a wireless adapter having a connector and a loop antenna with an integrated cap in which the loop antenna folds over the connector such that the integrated cap caps the connector and thereby protects the connector.

It is still a further object of the present invention to provide a wireless adapter having a connector connected at one end of a body and a loop antenna pivotally mounted at the other end of the body, the body having stops which interrupt the pivotal motion of the loop antenna at a position in which the loop antenna surrounds the sides of the body and the connector.

In carrying out the above objects and other objects, the present invention provides a wireless adapter having a body, a connector, and a geometrically loop-like antenna. The geometrical loop could be electrically connected as what is commonly known in the art as a "loop antenna" or alternately as a "whip", "monopole", or "vibrator" antenna. The body has opposite sides. The connector extends out from a first end of the body. The connector is adapted to be received by a host connector of a host device. The loop antenna is pivotally mounted to a second end of the body for pivotal movement about the second end of the body. The loop antenna is foldable into a closed position over the sides of the body and the connector to thereby surround the sides of the body and the connector in order to protect the connector when the connector is disconnected from the host connector of the host device.

The body may include a body stop extending out from each side of the body. The body stops interrupt the pivotal movement of the loop antenna about the body to define the closed position. The loop antenna rests against the body stops when the loop antenna is folded into the closed position. The connector may be a universal serial bus (USB) connector.

The loop antenna is a metal, highly conductive plastic or polymer, or metallized plastic loop antenna. The loop antenna has a length sufficiently sized to receive and transmit a signal having a desired frequency. A sum length of a length of the body and a length of the connector is smaller than the length of the loop antenna such that the loop antenna surrounds the sides of the body and the connector when the loop antenna is folded into the closed position.

The adapter may further include a cap having sides and an opening. The opening of the cap is configured for receiving the connector in order for the cap to cap the connector. A cap stop extends from a side of the cap for interrupting the pivotal movement of the loop antenna about the body to define the closed position. The loop antenna folds over into the closed position to surround the sides of the body and the cap when the cap is capping the connector and thereby locks the cap on to the connector.

Further, in carrying out the above objects and other objects, the present invention provides another wireless adapter which further includes an integrated cap at a distal end of a geometrically loop-like antenna. The integrated cap is configured to receive the connector. The geometrically loop-like antenna is foldable into a closed position over the sides of the body and the connector such that the integrated cap surrounds the connector in order to protect the connector when the connector is disconnected from the host connector of the host device.

BRIEF DESCRIPTION OF THE DRAWINGS

FIG. 3a illustrates a top angled view of a wireless adapter in accordance with a second embodiment of the present invention in an opened position;

FIG. 3b illustrates a top angled view of the wireless adapter shown in FIG. 3a in a closed position in which the integrated cap of the loop antenna surrounds the connector of the wireless adapter;

FIG. 3c illustrates a bottom view of the wireless adapter shown in FIG. 3b;

FIG. 4a illustrates a top angled view of the wireless adapter shown in FIG. 1 with a cap for capping the connector of the wireless adapter; and FIG. 4b illustrates a top angled view of the wireless adapter and the cap shown in FIG. 4a in which the cap caps the connector and the loop antenna is folded over the cap in the closed position to lock the cap in place on the connector.

DETAILED DESCRIPTION OF THE PREFERRED EMBODIMENT(S)

Figure 1:
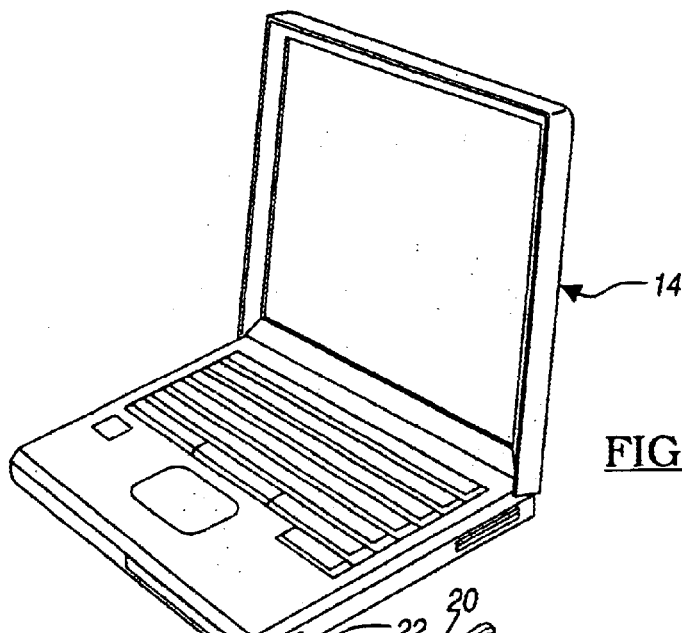
FIG. 1 illustrates a perspective view of a wireless adapter for use with a host device in accordance with a first embodiment of the present invention.

Referring now to the figures, FIG. 1 illustrates a perspective view of a wireless adapter 10 for use with a host device 14 in accordance with a first embodiment of the present invention. Adapter 10 generally includes a body 20, a connector 22, and a geometrically loop-like antenna 24. A host connector 12 of a host computer 14 receives connector 22 in order for adapter 10 to enable communication between the host computer and a peripheral (not shown). Connector 22 may be a universal serial bus (USB) plug and host connector 12 may be a corresponding USB port.

Figure 2A:
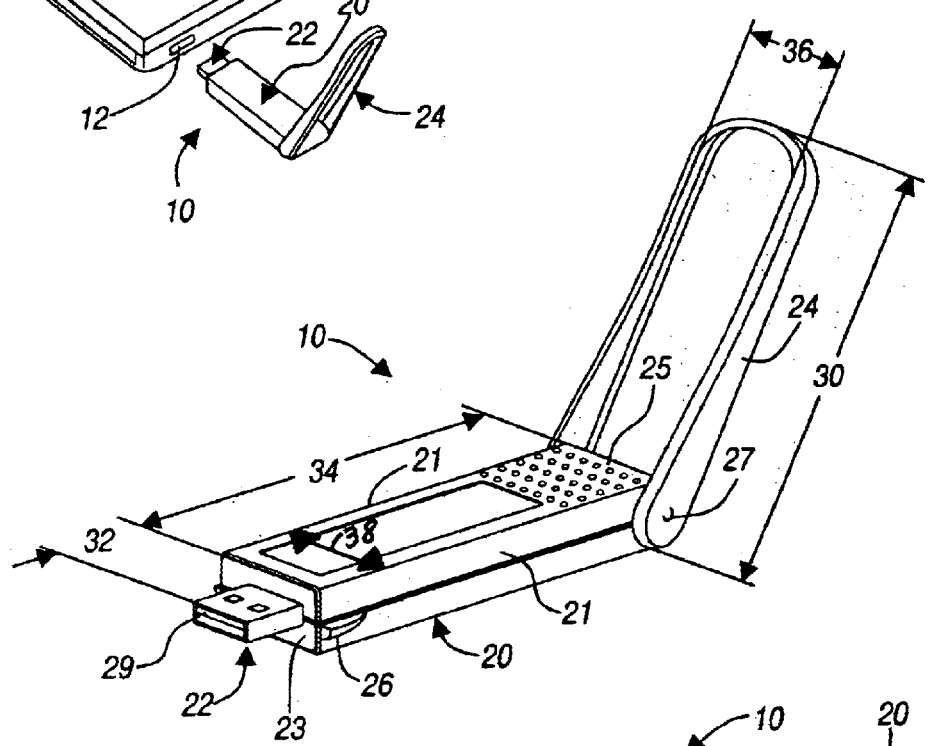
FIG. 2a illustrates a top angled view of the wireless adapter shown in FIG. 1 in an opened position.

FIG. 2a illustrates a top angled view of adapter 10 shown in FIG. 1 in an opened position. Body 20 includes first and second ends 23 and 25 and opposite sides 21. Connector 22 extends out from first end 23 of body 20 and has a front connector face 29. Front connector face 29 is open-ended. Loop antenna 24 is pivotally mounted about at an axis point 27 at second end 25 of body 20 for pivotal movement about the second end of the body. Loop antenna 24 is U-shaped as shown in the figures and is made of metal.

Body 20 may include electronics that serve as a transmitter and/or a receiver in order to enable host computer 14 to communicate with a peripheral when connector 22 is plugged into host connector 12 of the host computer. The transmitter and the receiver wirelessly communicate signals with the peripheral via loop antenna 24. Body 20 may also include a storage medium, like a flash disk. Storage medium within body 20 may be accessed by host computer 14. For example, the storage medium may store pictures, slides or files that can be accessed by host computer 14.

Figure 2B:
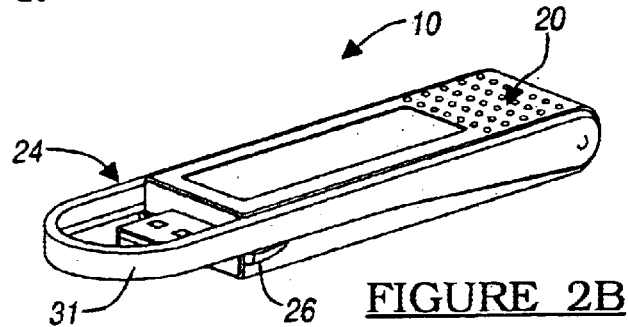
FIG. 2b illustrates a top angled view of the wireless adapter shown in FIG. 1 in a closed position in which the loop antenna surrounds the sides of the body and the connector of the wireless adapter.

Loop antenna 24 has a length 30 as shown in FIG. 2a. Loop antenna length 30 is a function of a frequency of a signal to be received or transmitted by loop antenna 24. Connector 22 has a length 32 in the direction extending out from first end 23 of body 20, and body 20 has a length 34 as shown in FIG. 2a. The sum length of connector length 32 and body length 34 is slightly less than loop antenna length 30 in order for the loop antenna to be able to surround sides 21 of body 20 and front face 29 of connector 22 when the loop antenna is folded to a closed position as shown in FIG. 2b. Similarly, inside width 36 of loop antenna 24 is slightly greater than width 38 of body 20 in order for the loop antenna to be able to fold over sides 21 of the body and connector 22.

A body stop 26 extends out from each side 21 of body 20. Body stops 26 interrupt the pivotal movement of loop antenna 24 about second end 25 of body 20 at a position in which the loop antenna surrounds sides 21 of body 20 and connector 22. Loop antenna 24 surrounds sides 21 of body 20 and connector 22 when the loop antenna is folded to a fully closed position as shown in FIG. 2b.

The advantages associated with loop antenna 24 being folded over to surround sides 21 of body 20 and connector 22 is that the loop antenna protects the body and the connector from physical damage such as nicks, bumps, and the like when the connector is disconnected from host computer 14. Furthermore, adapter 10 is conveniently transported and carried when loop antenna 24 is folded over in the closed position. Additionally, loop antenna 24, like a telescoping antenna, is a way to provide an antenna that is larger than body 20 to which it attaches. However, loop antenna 24 is simpler than a telescoping antenna.

FIG. 2b illustrates a top angled view of adapter 10 shown in FIG. 1 in the closed position in which loop antenna 24 surrounds sides 21 of body 20 and connector 22. In the closed position, loop antenna 24 folds over body 20 and a portion of the loop antenna rests on body stop 26. In the closed position, a distal end 31 of loop antenna 24 surrounds and protects connector 22.

FIGS. 3a and 3b illustrate top angled views of a wireless adapter 11 in accordance with a second embodiment of the present invention in opened and closed positions. Adapter 11 includes an integrated cap 40 built into a distal end 31 of loop antenna 24. Integrated cap 40 receives and caps connector 22 when loop antenna 24 is folded over body 20 and rests on stop 26 in the closed position as shown in FIG. 3b. Loop antenna 24 with integrated cap 40 rests on stop 26 in the closed position. As shown in FIG. 3c, integrated cap 40 includes an opening 42 that receives connector 22 when loop antenna 24 is folded over into the closed position.

FIG. 4a illustrates a top angled view of adapter 10 shown in FIG. 1 with a cap 50 for capping connector 22. Cap 50 has an opening for receiving connector 22 in order for the cap to cap the connector as shown in FIG. 4b. When capping connector 22, cap 50 completely surrounds the connector to protect the connector and opened front connector face 29 from physical damage and exposure to external elements such as moisture, dust, etc. Cap 50 may include a cap stop 52 extending out from at least a portion of the sides of the cap. Like body stop 26, cap stop 52 interrupts the range of pivotal movement of loop antenna 24 when the loop antenna is folded over body 20 and cap 50 in the closed position as shown in FIG. 4b.

In the closed position with loop antenna 24 being folded over body 20 and cap 50, the loop antenna locks the cap in place on connector 22 to prevent the cap from being inadvertently removed from the connector. In the closed position, loop antenna 24 rests on body stop 26 and cap stop 52.

While embodiments of the present invention have been illustrated and described, it is not intended that these embodiments illustrate and describe all possible forms of the present invention. Rather, the words used in the specification are words of description rather than limitation, and it is understood that various changes may be made without departing from the spirit and scope of the present invention.

What is claimed is:

1. A wireless adapter comprising:
   a body having opposite sides;
   a connector extending out from a first end of the body, the connector being adapted to be received by a host connector of a host device; and a loop antenna pivotally mounted to a second end of the body for pivotal movement about the second end of the body;

wherein the loop antenna is foldable into a closed position over the sides of the body and the connector to thereby surround the sides of the body and the connector.

2. The adapter of claim 1 further comprising:

a body stop extending out from each side of the body, the body stops interrupting the pivotal movement of the loop antenna about the body to define the closed position;

wherein the loop antenna rests against the body stops when the loop antenna is folded into the closed position.

3. The adapter of claim 1 wherein:

the connector is a universal serial bus connector.

4. The adapter of claim 1 wherein;

the body houses at least one of receiver and a transmitter.

5. The adapter of claim 1 wherein:

the body houses a storage medium.

6. The adapter of claim 1 wherein:

the body stops are at the first end of the body.

7. The adapter of claim 1 wherein:

the loop antenna is a metal loop antenna.

8. The adapter of claim 1 wherein:

the loop antenna is foldable into the closed position over the sides of the body and the connector to thereby surround the sides of the body and the connector in order to protect the connector when the connector is disconnected from the host connector of the host device.

9. The adapter of claim 1 wherein:

the loop antenna has a length appropriately sized to receive and transmit a signal having a desired frequency.

10. The adapter of claim 9 wherein:

a sum length of a length of the body and a length of the connector is smaller than the length of the loop antenna such that the loop antenna surrounds the sides of the body and the connector when the loop antenna is folded into the closed position.

11. The adapter of claim 1 further comprising:

a cap having sides and an opening, the opening of the cap configured for receiving the connector in order for the cap to cap the connector;

wherein the loop antenna folds over into the closed position to surround the sides of the body and the cap when the cap is capping the connector and thereby locks the cap onto the connector.

12. The adapter of claim 11 wherein:

the cap includes a cap stop extending from a side of the cap for interrupting the pivotal movement of the loop antenna about the body to define the closed position.

13. A wireless adapter comprising:

a body having opposite sides;

a connector extending our from a first end of the body, the connector being adapted to be received by a host connector of a host device;

a geometrically loop-like antenna pivotally mounted to a second end of the body for pivotal movement about the second end of the body; and an integrated cap at a distal end of the loop antenna, the integrated cap configured to receive the connector;

wherein the geometrically loop-like antenna is foldable into a closed position over the sides of the body and the connector such that the integrated cap surrounds the connector.

14. The adapter of claim 13 wherein:

the geometrically loop-like antenna is foldable into the closed position over the sides of the body and the connector such that the integrated cap surrounds the connector in order to protect the connector when the connector is disconnected from the host connector of the host device.

15. The adapter of claim 14 further comprising:

a body stop extending from each side of the body, wherein the body stops interrupt the pivotal movement of the loop antenna about the body to define the closed position;

wherein the geometrically loop-like antenna rests against the body stops when the geometrically loop-like antenna is folded into the closed position.

16. A method for providing protection of a connector of a wireless adapter, the wireless adapter including a body having opposite sides with the connector extending out from a first end of the body and a loop antenna pivotally mounted to a second end of the body, the body including stops extending out from each side of the body, the method comprising:

pivoting the loop antenna about the second end of the body towards the body stops; and surrounding the sides of the body and the connector with the loop antenna to protect the connector when the connector is disconnected from a host connector of a host device.

17. The method of claim 16 further comprising:

placing a cap onto the connector prior to the steps of pivoting and surrounding;

wherein the step of surrounding includes surrounding the cap with the loop antenna to lock the cap onto the connector.

18. The method of claim 16 wherein the loop antenna includes an integrated cap, wherein:

the step of surrounding includes surrounding the connector with the integrated cap.

* * * * *